US012749658B2

(12) United States Patent
Parkhe

(10) Patent No.: US 12,749,658 B2
(45) Date of Patent: Sep. 29, 2026

(54) CORROSION RESISTANT POLYMER COATINGS FOR MANUFACTURING EQUIPMENT COMPONENTS

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 571 days.

(21) Appl. No.: 18/077,138

(22) Filed: Dec. 7, 2022

(65) Prior Publication Data

US 2023/0197417 A1 Jun. 22, 2023

Related U.S. Application Data

(60) Provisional application No. 63/291,254, filed on Dec. 17, 2021.

(51) Int. Cl.

| | |
|---|---|
| ***H01J 37/32*** | (2006.01) |
| ***C09D 127/18*** | (2006.01) |
| *C09D 5/08* | (2006.01) |

(52) U.S. Cl.

CPC ...... *H01J 37/32495* (2013.01); *C09D 127/18* (2013.01); *C09D 5/08* (2013.01); *Y10T 428/1352* (2015.01)

(58) Field of Classification Search

CPC ... H01J 37/32495; C09D 127/18; C09D 5/08; C09D 127/12; Y10T 428/1352; C08K 3/013

See application file for complete search history.

(56) References Cited

U.S. PATENT DOCUMENTS

| | | | | |
|---|---|---|---|---|
| 4,178,850 A * | 12/1979 | Helmig | B41N 10/02 | 101/142 |
| 2003/0087100 A1* | 5/2003 | Amouroux | B05D 5/083 | 428/545 |
| 2003/0141821 A1* | 7/2003 | Nakano | H01J 37/32183 | 315/111.21 |
| 2010/0140222 A1* | 6/2010 | Sun | C09K 3/10 | 524/428 |
| 2011/0083806 A1 | 4/2011 | Noguchi et al. | | |
| 2011/0297319 A1* | 12/2011 | Chen | H01J 37/16 | 205/205 |
| 2016/0365228 A1 | 12/2016 | Singh et al. | | |
| 2019/0345319 A1* | 11/2019 | Shen | C08L 27/20 | |
| 2020/0283897 A1 | 9/2020 | Deepak et al. | | |
| 2021/0193440 A1 | 6/2021 | Ma et al. | | |
| 2022/0185980 A1 | 6/2022 | Yodogawa et al. | | |
| 2022/0389584 A1 | 12/2022 | Suda et al. | | |

FOREIGN PATENT DOCUMENTS

| | | |
|---|---|---|
| KR | 102225604 B1 | 3/2021 |
| WO | 2021075431 A1 | 4/2021 |

OTHER PUBLICATIONS

International Search Report and Written Opinion for International application No. PCT/US2022/052310 dated Apr. 26, 2023; 10 pages.

* cited by examiner

*Primary Examiner* — James C Yager

(74) *Attorney, Agent, or Firm* — Lowenstein Sandler LLP

(57) ABSTRACT

A chamber component for a semiconductor processing chamber includes a body. The chamber component also includes a coating. The coating is a corrosion-resistant coating. The coating is deposited on a surface of the body. The corrosion-resistant coating includes a perfluoroelastomer material.

16 Claims, 3 Drawing Sheets

CORROSION RESISTANT POLYMER COATINGS FOR MANUFACTURING EQUIPMENT COMPONENTS

RELATED APPLICATIONS

This patent application claims the benefit under 35 U.S.C. § 119(e) of U.S. Provisional Application No. 63/291,254, filed Dec. 17, 2021.

TECHNICAL FIELD

Embodiments of the present disclosure relate, in general, to coatings for components of manufacturing equipment. More specifically, the present disclosure relates to corrosion resistant polymer coatings for manufacturing equipment components.

BACKGROUND

Various manufacturing processes expose chamber components and their coating materials to high temperatures, high energy plasma, a mixture of corrosive gases, high stress, high strength electric fields, and combinations thereof. These extreme conditions may increase the components' and the coating materials' susceptibility to defects. Coatings are used which are effective at protecting chamber components from one or more of these damaging conditions. In some cases, a coating which protects against multiple conditions may be applicable to a particular component, chamber, process, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In one aspect of the disclosure, a chamber component for a semiconductor processing chamber is described. The chamber component includes a body and an organic corrosion-resistant coating deposited on a surface of the body. The organic corrosion-resistant coating includes a fluorinated polymer.

In another aspect of the disclosure, a method is described. The method includes depositing a fluorinated polymer precursor material onto a surface of a chamber component of a processing chamber. The method further includes curing the fluorinated polymer precursor material. Curing the fluorinated polymer precursor material generates an organic corrosion-resistant fluorinated polymer coating on the surface of the chamber component.

In another aspect of the disclosure, a processing chamber is described. The processing chamber includes a chamber component. The processing chamber also includes a coating. The coating is deposited on a surface of the chamber component. The coating includes an organic corrosion-resistant fluorinated polymer material.

BRIEF DESCRIPTION OF THE DRAWINGS

The present disclosure is illustrated by way of example, and not by way of limitation. It should be noted that different references to "an" or "one" embodiment in this disclosure are not necessarily to the same embodiment, and such references mean at least one.

DETAILED DESCRIPTION

Figure 1:
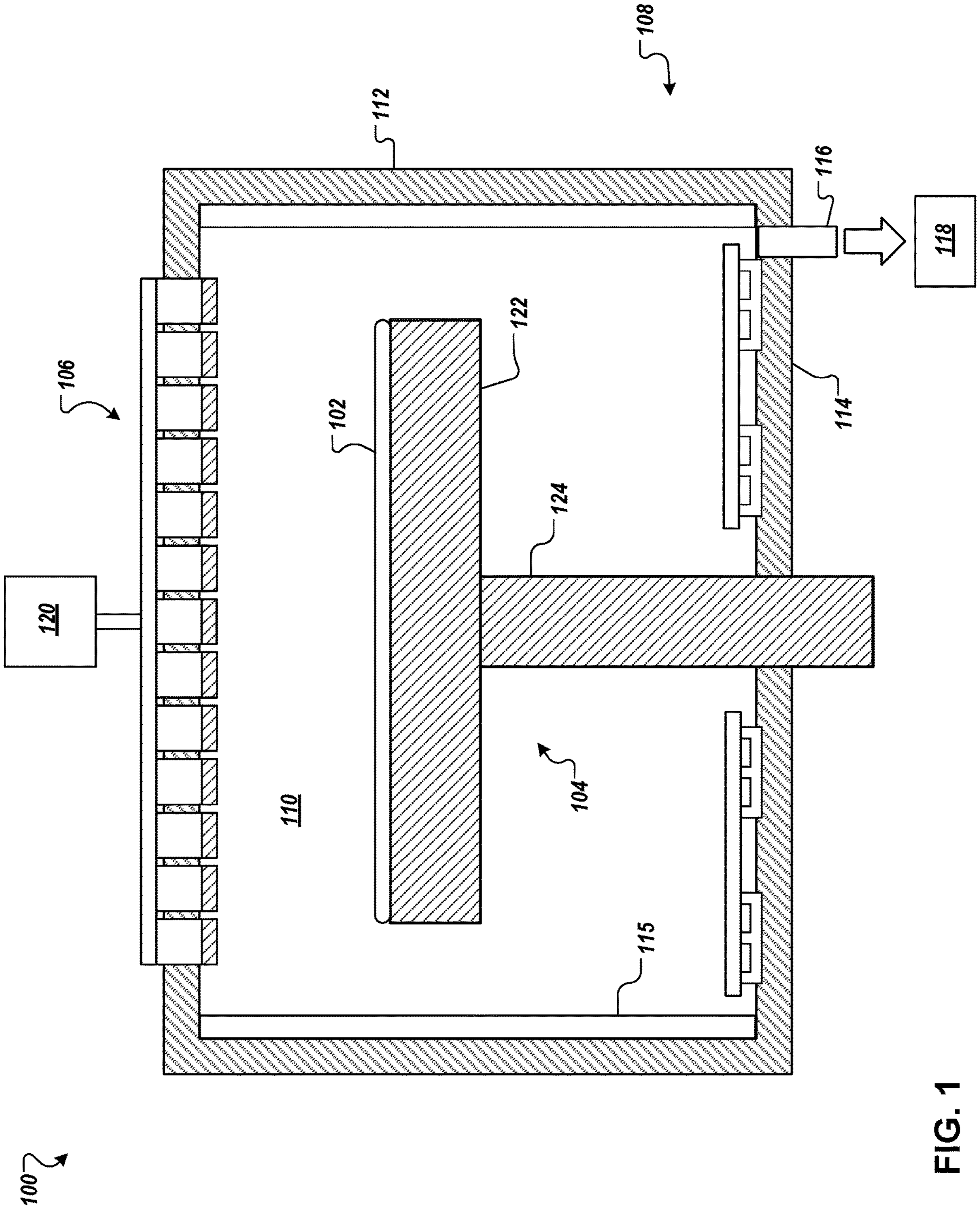
FIG. 1 is a sectional view of a processing chamber having one or more chamber components that may be coated with a high-temperature compatible protective coating, according to some embodiments.

Described herein are technologies related to providing protection to components of a manufacturing chamber by coating components in one or more resistant materials. Manufacturing equipment (e.g., processing chambers) is used to produce substrates, such as semiconductor wafers. The properties of substrates are determined by the conditions in which the substrates were processed. Components of the processing chamber impact conditions proximate to the substrate, and have an effect on performance (e.g., target substrate properties, consistency of production, etc.). In some embodiments, components of the processing chamber may experience harsh or damaging environments. Coating components in a resistant material may protect them from wear and/or damage due to these environments.

In some embodiments, processing may include large amounts of electrical energy, e.g., large currents, voltages, etc., in components of the processing chamber. In cases such as this, arcing may occur across gaps between manufacturing equipment components (e.g., intentional gaps, gaps induced by small manufacturing differences in the flatness or smoothness of adjacent surfaces, etc.). Arcing may result in damage to components, damage to substrates, unfavorable conditions, unintentional plasma generation, etc. Arcing occurs, for instance, when an electric field is strong enough to overcome the bonding energy of electrons of an insulator (e.g., air) and cause electric current to flow through the insulator. In vacuum, similar phenomena may be caused by electric fields strong enough to liberate electrons from a component to travel through the vacuum to another component, or electric fields that accelerate electrons liberated by other means.

In some embodiments, plasma may be used to process a substrate. Plasma processing may include generating a plasma from a halogen-containing gas, such as $C_2F_6$, $SF_6$, $SiCl_4$, HBr, $NF_3$, $CF_4$, $CHF_3$, $CH_2F_3$, $F_2$, $NF_3$, $Cl_2$, $CCl_4$, $BCl_3$, and $SiF_4$, among others, and other gases such as $O_2$ and $N_2O$. Plasma may interact with components of the processing chamber. Contact with plasma may cause damage or wear to components of the processing chamber. In some embodiments, corrosive gasses such as fluorine gas may be present within a processing chamber. Corrosive gasses may cause damage to components of a processing chamber, such as components constructed of aluminum, steel, molybdenum, $SiO_2$, etc.

In conventional systems, components of processing chambers that are subjected to such environments are protected by coating them with a resilient ceramic material. Ceramic materials may exhibit plasma resistance, corrosive gas resistance, etc. Some ceramic materials may not provide sufficient electrical protection for a component of a processing chamber. Ceramic materials may expand and contract differently than the component they are coating, and may thus crack, flake, or otherwise be compromised in applications where temperature of the component varies significantly. Coating a component with a ceramic material may involve a considerable time investment. Plasma resistant coatings are often applied by blanketing a region with high-energy particles, such as via plasma spray coating or ion assisted deposition, which can take a considerable amount of time for thicker coatings.

Methods and devices of the current disclosure address at least some deficiencies of a conventional approach. In some embodiments, a component of a manufacturing chamber may be utilized in a high-temperature application and be subjected to a damaging environment (e.g., corrosive environment), such as contacting plasma or fluorine gas introduced for substrate processing. A component of a processing chamber may be coated in a protective material composed of a fluorinated polymer. The fluorinated polymer may be a perfluoroelastomer (e.g., FFKM) material. Perfluoroelastomer materials may be stable at high temperatures, provide electrical protection, be resistant to some types of plasmas and fluorine gasses used in processing (e.g., corrosion resistant), and be compliant such that thermal expansion of a underlying component may not cause the coating to become compromised. In some embodiments, a fluorinated polymer material may maintain plasma resistance, fluorine resistance, corrosion resistance, and other properties associated with maintaining protection of an underlying component up to at least 250° C. In some embodiments, resistance and other properties may be substantially maintained up to temperatures of 280° C., 290° C., 300° C., or 310° C. Conventional plasma resistant ceramic coatings exhibit significantly different thermal expansion properties than a typical component of manufacturing equipment, e.g., the ceramic material experiences significantly less thermal expansion than an aluminum body it is applied to. This mismatch of thermal expansion can cause the ceramic plasma-resistant layer to crack, chip, peel, or otherwise be damaged if the component is used in a high temperature environment (e.g., above 100° C., above 125° C., etc.). Fluorinated polymer materials exhibit a high degree of compliance, especially at higher temperatures. Fluorinated polymer coatings may deform sufficiently readily to avoid being damaged as a component the coating is applied to changes temperature. The resistance of the coating material to a corrosive or damaging environment may be measured through "etch rate" (ER), which may have units of Angstrom/min (Å/min), throughout the duration of the coated components' operation and exposure to environment. Resistance may also be measured through an erosion rate having the units of nanometer/radio frequency hour (nm/RFHr), where one RFHr represents one hour of processing in corrosive processing conditions. Measurements may be taken after different processing times. For example, measurements may be taken before processing, after 50 processing hours, after 150 processing hours, after 200 processing hours, and so on. An erosion rate lower than about 100 nm/RFHr is typical for a resistant coating material. A single resistant material may have multiple different resistance or erosion rate values. For example, a resistant material may have a first resistance or erosion rate associated with a first type of corrosive or damaging environment and a second resistance or erosion rate associated with a second type of corrosive or damaging environment. Perfluoroelastomer (e.g., FFKM) materials exhibit strong resistance to fluorine corrosion and may exhibit resistance to plasma.

Embodiments of the present disclosure enable an article such as a chamber component for a processing chamber having a layer of material providing a fluorine environment-resistant, corrosion-resistant, and plasma-resistant coating layer on one or more surfaces of the article. The protective layer includes a polymer. The polymer may include polymers of ethylene (e.g., polymers of ethylene monomers, which may or may not be synthesized directly from ethylene) and related compounds, such as fluorine substituted ethylene (e.g., polymers including fluorinated ethylene monomers such as vinylidene fluoride). The polymer materials may include hexafluoropropylene monomers, tetrafluoroethylene monomers, perfluoromethylvinylether monomers, and the like. The polymer may be deposited on the chamber component using any suitable means, such as blade coating, spray coating, thermal spray coating, aerosol deposition, pulsed laser deposition, plasma polymerization, flow coating, spin coating, dip coating, etc.

FIG. 1 is a sectional view of a processing chamber 100 having one or more chamber components that may be coated with a high-temperature compatible protective coating, according to some embodiments. Processing chamber 100 may be used for processes in which components of processing chamber 100 carry high amounts of electrical energy, such as large currents, voltages, etc. Processing chamber 100 may be used for processes in which a corrosive plasma environment having plasma processing conditions is provided. For example, the processing chamber 100 may be a chamber for a plasma etcher or plasma etch reactor, a plasma cleaner, and so forth. Processing chamber 100 may be used for processes in which a corrosive fluorine gas environment is maintained, such as chemical etching processes. Examples of chamber components that may include a high temperature resistant coating layer include a substrate support assembly 104, an electrostatic chuck (ESC), a ring (e.g., a process kit ring or single ring), a chamber wall, a base, a gas distribution plate, a showerhead 106, a nozzle, a lid, an inner liner, outer liner 115, a liner kit, a shield, a plasma screen, a flow equalizer, a cooling base, a chamber viewport, a chamber lid, and so on. Chamber components may be constructed of any suitable material, including metals (e.g., aluminum, stainless steel, molybdenum, etc.), ceramic materials (e.g., $SiO_2$, $Al_2O_3$, etc.), etc. The coating applied to one or more components of the chamber may include a polymer component, such as a perfluoroelastomer or FFKM component.

In one embodiment, processing chamber 100 includes a chamber body 108 and a showerhead 106 that enclose an interior volume 110. The showerhead may include a showerhead base and a showerhead gas distribution plate. Alternatively, the showerhead 106 may be replaced by a lid and a nozzle in some embodiments. The chamber body 108 may be fabricated from aluminum, stainless steel or other suitable material. The chamber body 108 generally includes sidewalls 112 and a bottom 114. An outer liner 115 may be disposed adjacent to sidewalls 112 to protect chamber body 108. Any of the showerhead 106 (or lid and/or nozzle), sidewalls 112, outer liner 115, and/or bottom 114 may include high-temperature compatible resistant coating layer.

An exhaust port 116 may be defined in chamber body 108, and may couple the interior volume 110 to a pump system 118. The pump system 118 may include one or more pumps and throttle valves utilized to evacuate and regulate the pressure of the interior volume 110 of processing chamber 100.

Showerhead 106 may be supported on the sidewall 112 of the chamber body 108. The showerhead 106 (or lid) may be opened to allow access to the interior volume 110 of processing chamber 100, and may provide a seal for processing chamber 100 while closed. A gas panel 120 may be coupled to processing chamber 100 to provide process and/or cleaning gases to the interior volume 110 through showerhead 106 or lid and nozzle. Showerhead 106 is used for processing chambers used for dielectric etch (etching of dielectric materials). The showerhead 106 includes a gas distribution plate (GDP) having multiple gas delivery holes throughout the GDP. Showerhead 106 may include the GDP bonded to an aluminum base or an anodized aluminum base. The GDP may be made from Si or SiC, or may be a ceramic such as $Y_2O_3$, $Al_2O_3$, YAG, and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$. The lid, showerhead base, GDP and/or nozzle may be coated with a high-temperature compatible corrosive environment resistant coating.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). Substrate support assembly 104 is disposed in interior volume 110 of processing chamber 100 below showerhead 106 or the lid. Substrate support assembly 104 holds substrate 102 during processing. A ring (e.g., a single ring) may cover a portion of the support assembly 104 (e.g., susceptor 122), and may protect the covered portion from exposure to plasma or other corrosive materials during processing. The ring may be silicon or quartz in one embodiment. Substrate support assembly 104 may include one or more elements, in some embodiments including a pedestal 124, and a susceptor 122.

In some embodiments, outer liner 115 may be coated by a fluorinated polymer material, a perfluoroelastomer, an FFKM material, etc. Other components of the processing chamber may be coated in the same coating or a different coating. In some embodiments, the polymer layer may be applied directly to the component body, e.g., a metal component, a ceramic component, etc. In some embodiments, the polymer layer may be applied using aerosol deposition. Aerosol deposition will be discussed in more detail in connection with FIG. 3. In some embodiments, the polymer layer may be applied using dip coating or blade coating. In some embodiments, a seal is made between parts (e.g., to maintain vacuum conditions of inner volume 110). In some embodiments, a seal may be made on a surface coated with at least some components of a resistant coating. For example, a polymer layer of a coating may extend along a surface of a component from an area of controlled environment (e.g., vacuum) to an uncontrolled area (e.g., outside the processing chamber) and a seal may be made against the component to maintain separation of the two environments. In some embodiments, the polymer coating may extend beyond the area where processing occurs, and the seal (e.g., an o-ring, a gasket) may make a seal against the coating. For example, a fluoropolymer coating may be applied to pedestal 124. The area coated may include the portion of pedestal 124 that passes through chamber bottom 114. A seal may be made on the fluoropolymer coating between pedestal 124 and chamber bottom 114.

Figure 2:
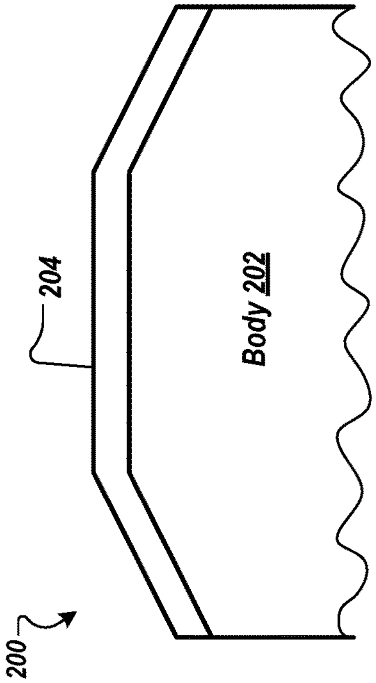
FIG. 2 depicts a sectional view of an exemplary coated article, according to some embodiments.

FIG. 2 depicts a sectional view of an exemplary coated article, according to some embodiments. FIG. 2 illustrates a coated article 200 having a body 202 and coating 204. Body 202 may be any of various chamber components including but not limited to substrate support assembly, an electrostatic chuck (ESC), a ring (e.g., a process kit ring or single ring), a chamber wall, a base, a gas distribution plate, a showerhead, a nozzle, a lid, a liner, a liner kit, a shield, a plasma screen, a flow equalizer, a cooling base, a chamber viewport, a chamber lid, and so on. The body may be made from a metal (such as aluminum, molybdenum, or stainless steel), a ceramic, a metal-ceramic composite, a polymer, a polymer ceramic composite, or other suitable materials.

In some embodiments, a coating 204 applied directly to body 202 may include a polymer material. In some embodiments, one or more primer layers are applied to body 202 before coating 204. Polymer materials tend to exhibit high dielectric strengths, e.g., have high resistance to breakdown or arcing in high electric field environments. A polymer may be provided for coating 204 with a high dielectric strength, for example, above 20 MV/m, above 50 MV/m, above 70 MV/m, or any other threshold appropriate for the intended use of body 202. Other considerations may also be included in a determination of a material to use in coating layer 204, for example thermal expansions properties, ease of working with the material, chemical properties, physical properties, surface properties, affinity for the material of body 202, etc. The material chosen for coating 204 may be chosen to provide protection to article 200 from a damaging environment. Article 200 may have a target use in a process where it will come into contact with plasma, fluorine gas, or other corrosive or damaging materials.

Some conventional chamber component compositions may be deficient when operating in a fluorine or fluorine plasma environment. Components may be constructed of aluminum, coated with aluminum, coated with an aluminum oxide-based ceramic layer, etc. Aluminum oxide provides good properties in many settings. In fluorine environments, aluminum and aluminum oxide may form aluminum fluoride particles. In fluorine environments, aluminum metal may contaminate the chamber, e.g., contaminate a substrate processed in the chamber. A high erosion rate of aluminum oxide may lead to arcing in some cases, reducing life of a component or operation time between maintenance. Some chamber components may be coated in yttrium oxide. Yttrium oxide may react with a fluorine environment to form yttrium fluoride at the surface of the coating. The protective coating may absorb some percentage of the fluorine. This may reduce the amount of fluorine available for processing of the substrate. This may reduce a processing rate. The fluoride may also later be sputtered from the protective coating, which may increase the amount of fluorine in the chamber environment beyond process specifications. The stability of a process rate in the chamber may be impacted.

The material of coating 204 may exhibit resistance to a fluorine or fluorine plasma environment. In some embodiments, coating 204 may include a fluorinated polymer. In some embodiments, coating 204 may include a perfluoroelastomer. In some embodiments, coating 204 may include a FFKM material. The material of coating 204 may also contain various additives, such as additives to alter properties of coating 204 (e.g., plasticizers), additives to protect or extend the lifetime of coating 204 (e.g., UV-absorbing materials), etc. The material of coating 204 may also include a ceramic material. In some embodiments, coating 204 may contain a powdered ceramic material (e.g., SiC, $Al_2O_3$, AlN, $Y_2O_3$, etc.). The particle size of the powdered material may be less than 10 μm, less than 1 μm, etc. The ceramic material may be included in the coating material in an amount less than 30% (measured by volume). In some embodiments, the ceramic material may be included in an amount between 5% and 25%. In some embodiments, the ceramic material may be included in an amount between 10% and 20%. The inclusion of ceramic material particles in the polymer of the coating material may improve the plasma resistance of the coating.

Coating 204 may be applied using any technique suitable for depositing a thin layer of polymer on a body, such as aerosol coating, dip coating, blade coating, spin coating, etc. A range of polymers may be suitable for coating 204. Suitable polymers may include polymers of ethylene, polymers of propylene, polymers of styrene, polymers comprising monomers of more than one structure, polymers including fluorinated versions of these monomers, or other polymers. In some embodiments, a mixture of polymers may be used. Coating 204 may be of any appropriate thickness. In some embodiments, coating 204 may be less than 1000 micrometers (μm) thick. In some embodiments, coating 204 may be between 1 μm and 500 μm thick. In some embodiments, coating 204 may be between 5 μm and 100 μm thick. In some embodiments, the surface of coating 204 may undergo further processing after deposition (e.g., polishing, smoothing, etc.). Additives may be included in the coating process, e.g., plasticizers, stabilizers, or ceramic particles may be included in the dip-coating liquid, aerosol particles, etc., may be added to the coating after the polymer coating material is deposited on the body of the component, etc.

In some embodiments, the final corrosion resistant coating material (e.g., coating layer 208, coating layer 218) may be a thin film. In some embodiments, the coated article may comprise several layers of final corrosion resistant coating material forming thin film stacks. In some embodiments, layers may not be uniform in thickness or composition, e.g., layers deposited further from the component may contain more or different additives, etc. Each thin film plasma resistant coating material layer may have a thickness of less than approximately 20 micrometers, and less than approximately 10 micrometers in some embodiments. Thin film coatings may be advantageous for improved chamber performance in some embodiments due to their dense and defect free characteristics.

Figure 3:
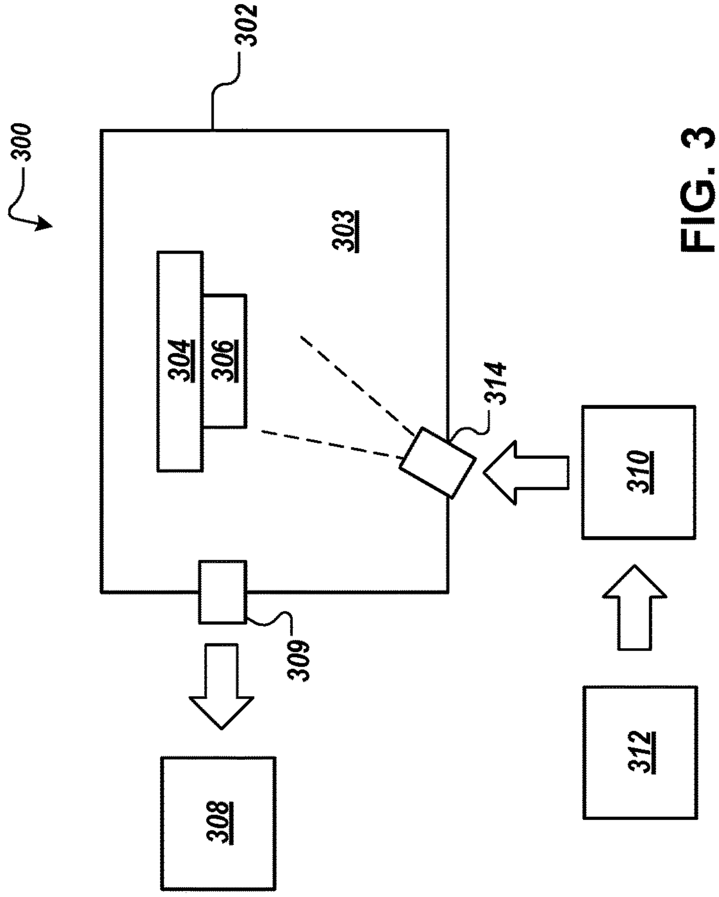
FIG. 3 illustrates an exemplary architecture of a deposition system for performing aerosol deposition, according to some embodiments.

FIG. 3 illustrates an exemplary architecture of a deposition system 300 for performing aerosol deposition, according to some embodiments. System 300 may be used for applying various coatings to a component of processing equipment. System 300 may be used to apply coatings of many types of materials, including polymer coatings (e.g., high dielectric strength coatings), ceramic coatings (e.g., plasma resistant coatings), coatings including multiple components (such as a polymer phase and a ceramic phase), or other types of coatings. System 300 includes a deposition chamber 302. The deposition chamber may include a stage 304 for mounting a component 306 to be coated (e.g., body 202 of FIG. 2, etc.). Component 306 may be constructed of a metal (e.g., aluminum, stainless steel, molybdenum, etc.), a ceramic, a polymer, a composite material, etc. Ambient pressure in interior volume 303 of chamber 302 may be reduced via a vacuum system 308, coupled to inner volume 303 via exhaust port 309 defined in the body of chamber 302. Aerosol chamber 310 contains a coating powder for coating component 306, such as a polymer powder, a metal oxide powder, a mixture of powders, etc. aerosol chamber 310 is coupled to gas container 312. The coating material in aerosol chamber 310 may be in the form of a fine powder, e.g., may have particles ranging from a few μm to a few hundred μm in size. A carrier gas flows from gas container 312, through aerosol chamber 310 to interior volume 303. The carrier gas propels the coating powder through nozzle 314 for directing the coating powder onto component 306 to form a coating.

The component 306 may be a component used for semiconductor manufacturing. Component 306 may be a component of an etch reactor, a thermal reactor, a semiconductor processing chamber, or the like. Examples of possible components include a lid, a substrate support, process kit rings, a chamber liner, a nozzle, a showerhead, a wall, a base, a gas distribution plate, etc. Component 306 may be formed of a material such as aluminum, silicon, quartz, a metal oxide, a ceramic compound, a polymer, a composite, etc.

In some embodiments, the surface of component 306 may be polished to reduce a surface roughness of component 306. Reducing surface roughness may improve coating thickness and uniformity. In some embodiments, surface roughness is reduced until it is lower than the target thickness of a coating layer. In some embodiments, not all areas of component 306 are to be coated. Areas of component 306 may be masked or shielded, or otherwise removed from the area accessed by the aerosol powder. In some embodiments, coating may be removed from areas that are not to be coated after coating.

Component 306 may be mounted on stage 304 in deposition chamber 302 during deposition of a coating. Stage 304 may be a moveable stage (e.g., motorized stage) that can be moved in one, two, or three dimensions, and/or rotated in one or more dimensions, such that stage 304 can be moved to different positions to facilitate coating of component 306 with coating powder propelled from nozzle 314. For example, stage 304 may be moved to coat different portions or sides of component 306. Nozzle 314 may be selectively aimed at certain portions of component 306 from various angles and orientations.

In some embodiments, deposition chamber 302 may be evacuated using vacuum system 308. Providing a vacuum environment in inner volume 303 may facilitate application of the coating. For example, the coating powder propelled from nozzle 314 encounters less resistance as it travels to component 306 when inner volume 303 is under vacuum. Coating powder may impact component 306 more regularly, at a higher rate of speed, etc., which may facilitate adherence to component 306, facilitate formation of a coating, reduce wasted coating material, etc.

Gas container 312 holds a pressurized carrier gas. Pressurized carrier gasses that may be used include inert gasses, such as argon, nitrogen, krypton, etc. The pressurized carrier gas travels under pressure from gas container 312 to aerosol chamber 310. As the pressurized gas travels from aerosol chamber 310 to nozzle 314, the carrier gas propels some of the coating powder from aerosol chamber 310 toward nozzle 314.

In some embodiments, system 300 may be used to deposit a single material onto one or more surfaces of component 306. In some embodiments, system 300 may be used to deposit multiple materials onto component 306, e.g., a polymer precursor material and a powdered ceramic material. In some embodiments, a polymer layer including multiple polymers may be deposited on component 306. In some embodiments, a ceramic layer including multiple ceramic materials may be deposited on component 306. Multiple materials may be co-deposited by providing a mixture of powdered materials to aerosol chamber 310. In an alternate embodiment, two or more aerosol chambers may be coupled to pressurized gas and to nozzle 314, with each providing material to nozzle 314 separately. In an alternate embodiment, multiple nozzles may receive material from multiple aerosol chambers coupled to pressurized carrier gas. These embodiments may allow multiple materials to be deposited simultaneously.

As the carrier gas propelling a suspension of coating powder enters deposition chamber 302 from nozzle 314, the coating powder is propelled towards component 306. In one embodiment, the carrier gas is pressurized such that the coating powder is propelled towards component 306 at a rate between 150 m/s and 500 m/s. In some embodiments, particle size of the coating powder(s), and pressure(s) of carrier gas(ses) may be tuned for a target velocity distribution of coating powder.

In some embodiments, nozzle 314 is formed to be wear resistant. Due to movement of coating powder through nozzle 314 at high velocity, nozzle 314 can rapidly wear and degrade. Nozzle 314 may be formed in a shape and from a material such that wear is reduced.

In some embodiments, upon impacting component 306 particles of the coating powder fracture and deform from kinetic energy to produce a layer that adheres to component 306. As the application of coating powder continues, the particles become a coating or film by bonding to themselves. The coating on component 306 continues to grow by continuous collision of the particle of the coating powder on component 306. In some embodiments, particles mechanically collide with each other and with the substrate at a high speed under a vacuum to break into smaller pieces to form a dense layer, rather than melting. In some embodiments, crystal structure of particles of coating powder in aerosol chamber 310 is preserved through application to component 306. In some embodiments, melting of particles may occur when kinetic energy is converted to thermal energy. In some embodiments, aerosol deposition may be performed at room temperature, or between 15° C. and 35° C. In some embodiments, component 306 does not need to be heated and the aerosol application process may not significantly increase the temperature of component 306. Applications such as this may be used to coat assemblies that may be damaged in an environment of elevated temperature. For example, components formed of multiple parts affixed together with a bonding layer that melts at a low temperature may be damaged in a deposition process carried out at elevated temperatures. As a further example, components formed of multiple parts of different materials with different thermal expansion properties may be damaged as the parts expand at different rates, to different sizes, etc., during deposition. Such components may be less likely to be damaged by coating at ambient temperatures.

In some embodiments, aerosol deposition may be performed at an elevated temperature. In some embodiments, component 306 may be heated before or during aerosol deposition. Such heating may encourage melting or softening of the material of the coating powder. In some embodiments, after deposition occurs, component 306 may be placed in an oven for heating of the component and coating material for a time. The temperature of component 306 and the coating may increase, such that the coating partially or fully melts. The coating may be allowed to flow over the surface of component 306, for example to improve uniformity of the coating, to allow the coating to reach new areas of the surface of component 306, etc.

In some embodiments, the coated component may be subjected to a post-coating process. For example, a coating may be polished or smoothed after application to component 306. Coated components may be subjected to other post-coating processes, such as thermal treatment. Thermal treatment in some embodiments alters the chemical composition of the coating. For example, an FFKM coating may produce additional cross-links during a thermal curing treatment to form a polymer network or elastomer structure. In some embodiments, a perfluoroelastomer precursor material may include a fluorinated polymer material with sites susceptible to crosslinking and materials that promote crosslinking. A perfluoroelastomer precursor coating may be heat treated (e.g., at 250° C. for 1 or more hours) to form a perfluoroelastomer coating.

In some embodiments, a chamber component may be dip-coated in a solution to form a corrosion resistant coating. Parts of the chamber component may be masked before the dip-coating, to avoid depositing a layer of the organic corrosion resistant coating material (e.g., a perfluoroelastomer precursor material) on the masked regions. In some embodiments, the chamber component may include a number of elements (e.g., parts). Masking may include masking one or more elements entirely, masking a portion of a surface of one element, masking a portion of a surface of multiple elements, etc. In some embodiments, the chamber component may be dipped into a solution comprising a coating precursor. Further curing operations may convert the coating precursor into the organic corrosion resistant coating. In some embodiments, the precursor solution comprises a fluorinated polymer, including cross-linking functional groups, and one or more curing agents to facilitate reactions between cross-linking functional groups. The chamber component may be dipped in the precursor solution, and then cured. The curing process may cause cross-linking between the fluorinated polymer chains. The resulting coating is a highly cross-linked fluoroelastomer, such as an FFKM material. In some embodiments, the chamber component may be dipped in a solution including an organic polymer. A curing agent facilitating cross-linking may be added to the polymer precursor material on the surface of the chamber component. Cross-linking may occur once the curing agent is added, resulting in an elastomer coating. In some embodiments, the solution may include monomers, such as tetrafluoroethylene. The chamber component may be dipped in the solution, and polymerization and/or elastomerization may be initiated after coating. The thickness of the coating may be controlled by controlling the viscosity of the solution the chamber component is dipped in, e.g., by solvent selection, precursor concentration selection, additives, etc. In some embodiments, solvent may be added to the precursor solution. This may reduce the viscosity of the solution and reduce the thickness of the coating formed using the precursor solution. In some embodiments, the thickness of the cured coating may be less than 1000 μm. In some embodiments, the thickness of the cured coating may be 1 μm to 200 μm. In some embodiments, curing of the coating may include maintaining the component at an elevated temperature for a time sufficient to drive off solvent, complete elastomerization, etc. In some embodiments, the component may be maintained at temperatures between 200° C. and 300° C. In some embodiments, the component may be maintained at temperature between 250° C. and 280° C. In some embodiments, the component may be cured for a period of time less than an hour. In some embodiments, the component may be cured for a period of time greater than an hour. In some embodiments, the component may be cured for a period of time greater than three hours.

In some embodiments, application of a liquid may occur without dipping. In some embodiments, precursor material may be applied to the component by an application tool, such as in blade coating. In any embodiment, polymerization or elastomerization chemistry of the coating material may occur after precursor material is deposited on one or more surfaces of the chamber component.

In some embodiments, the precursor solution may include components non-organic components, such as ceramic component. The ceramic components may be included in the form of a powder, e.g., with particle sizes of less than 1 μm. The ceramic particles may be deposited along with the organic corrosion resistant material precursor. The cured perfluoroelastomer material may include impregnated ceramic particles. In some embodiments, additional materials (e.g., ceramic materials) may be deposited after dip-coating, e.g., by aerosol deposition.

Figure 4:
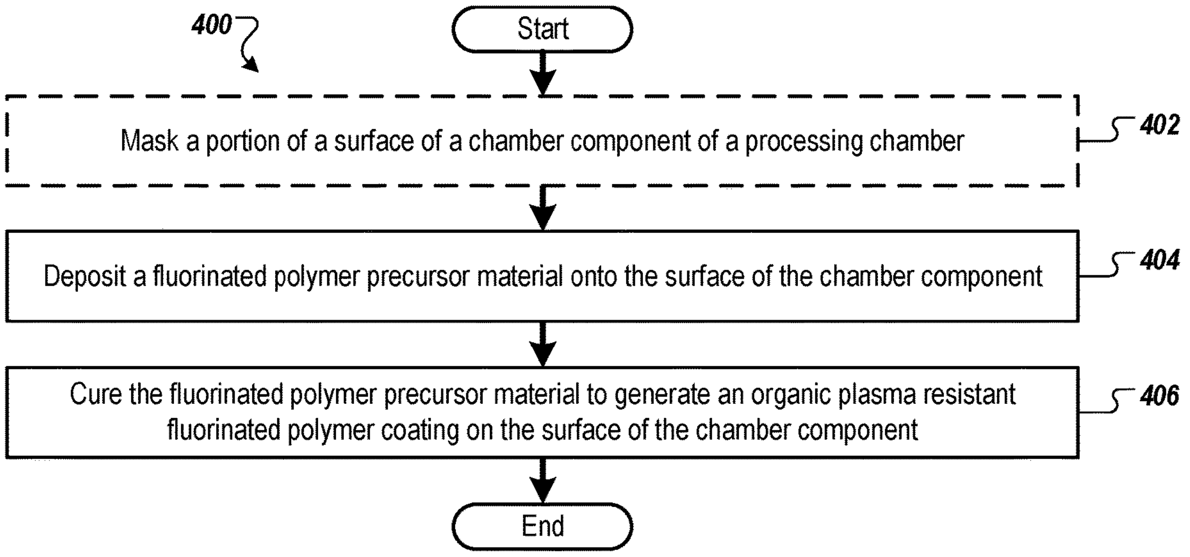
FIG. 4 is a flow diagram depicting a method related to generating fluorine resistant organic coatings, according to some embodiments.

FIG. 4 is a flow diagram depicting a method related to generating fluorine resistant organic coatings, according to some embodiments. At block 402, a portion of a surface of a chamber component of a processing chamber is optionally masked. Masking may include hard masking, soft masking, mask baking, etc. In some embodiments, a portion of the surface of the chamber component that is not to be coated in the fluorine resistant material is masked. In some embodiments, potions of the chamber component may be masked to restrict access of a fluorine resistant material to some portion of the component. For example, a component may be dip-coated in a solution including a perfluoroelastomer precursor. The component may have an external structure not well suited to dip-coating (e.g., concave portions where liquid may pool, creating an uneven coat), internal structure (e.g., cavities accessible by opening in the surface of the component), or the like. Masking may be used to restrict contact of the precursor solution to the external structure, prevent flow of the precursor solution into the opening accessing the internal structure, etc.

At block 404, a fluorinated polymer precursor material is deposited onto the surface of the chamber component. The fluorinated polymer precursor may be deposited by aerosol deposition, dip coating, blade coating, or any other technique suitable for applying a thin film to a body. In some embodiments, the precursor includes fluorinated polymer and a curing agent. The curing agent may facilitate creation of a cross-linked elastomer from the polymer material. In some embodiments the precursor includes fluorinated monomers to by polymerized. In some embodiments, the precursor is dissolved or suspended in a solvent. The composition of the solvent, concentration of the precursor and other additives, etc., may be tuned to generate a target viscosity and/or coating thickness. In some embodiments, a material may be deposited on the surface of the component before the fluorinated polymer precursor, such as a primer material. In some embodiments, the material applied before the precursor material may include a curing agent.

At block 406, the fluorinated polymer precursor material is cured to generate an organic corrosion resistant fluorinated polymer coating on the surface of the chamber component. In some embodiments, the coating material includes an FFKM material. In some embodiments, the coating material includes a perfluoroelastomer material. In some embodiments, a curing agent may be deposited on the component after the precursor material. In some embodiments, the coating may be cured in a thermal curing process. In some embodiments, a thermal curing process may be performed between 200° C. and 300° C. in some embodiments, the thermal curing process may be performed between 250° C. and 280° C. In some embodiments, the thermal curing process may be performed for more than an hour. In some embodiments, the thermal curing process may be performed for more than three hours.

The preceding description sets forth numerous specific details such as examples of specific systems, components, methods, and so forth, in order to provide a good understanding of several embodiments of the present disclosure. It will be apparent to one skilled in the art that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Preceding descriptions refer to applying coatings to various components, bodies, articles, etc. In some cases, a coating or layer is described as being applied "on" or "onto" a body, layer, material, etc. Unless clear from the context, a layer described as being "on" a layer, body, component, material, etc., may not be directly adjacent to what the layer is on, and there may be an intervening layer of another material between.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A chamber component for a semiconductor processing chamber, comprising:

a body; and a corrosion-resistant coating deposited on a surface of the body, wherein the corrosion-resistant coating comprises a stack of thin films, and wherein each thin film comprises:

an organic perfluoroelastomer material, and one or more additives, comprising at least one of plasticizers, stabilizers, or ceramic particles, wherein each thin film of the stack of thin films is of a different composition, and wherein a portion of the surface of the body on which the corrosion-resistant coating is deposited extends from a portion of the semiconductor processing chamber configured to generate a controlled environment to a region outside the controlled environment, and is in contact with a sealing component to form a seal.

2. The chamber component of claim 1, wherein the perfluoroelastomer material comprises an FFKM material, and wherein the corrosion-resistant coating is impregnated with a powdered ceramic material, the powdered ceramic material being present in the corrosion-resistant coating in an amount of 5% to 25% by volume.

3. The chamber component of claim 1, wherein the corrosion-resistant coating has a thickness of 1 μm to 200 μm.

4. The chamber component of claim 1, wherein the body comprises at least one of aluminum, molybdenum, or steel.

5. The chamber component of claim 1, wherein the body comprises a processing chamber sidewall.

6. The chamber component of claim 1, wherein the corrosion-resistant coating maintains corrosion resistant properties at a temperature of at least 300° C.

7. A processing chamber, comprising:

A chamber component; and a corrosion-resistant coating deposited on a surface of the chamber component, the corrosion-resistant coating comprising a stack of thin films, and wherein each thin film comprises:

an organic corrosion-resistant perfluoroelastomer material, and one or more additives, comprising at least one of plasticizers, stabilizers, or ceramic particles, wherein each thin film of the stack of thin films is of a different composition; and wherein a portion of the surface of the chamber component on which the corrosion-resistant coating is deposited extends from a portion of the processing chamber configured to generate a controlled environment to region outside the controlled environment, and is configured to be in contact with a sealing component to form a seal.

8. The processing chamber of claim 7, wherein the organic corrosion-resistant perfluoroelastomer material comprises an FFKM material, and wherein the corrosion-resistant coating is impregnated with a powdered ceramic material, the powdered ceramic material being present in the corrosion-resistant coating in an amount of 5% to 25% by volume.

9. The processing chamber of claim 7, wherein the corrosion-resistant coating has a thickness of 1 μm to 200 μm.

10. The processing chamber of claim 7, wherein the chamber component comprises:

a chamber sidewall;

a liner; or a substrate support.

11. The processing chamber of claim 7, wherein the corrosion-resistant coating maintains corrosion resistance from 15° C. to 300° C.

12. The processing chamber of claim 7, wherein the corrosion-resistant coating is sufficiently compliant to resist damage due to thermal expansion mismatch between the corrosion-resistant coating and the chamber component.

13. The chamber component of claim 1, further comprising a primer disposed on the surface of the body between the body and the organic perfluoroelastomer material.

14. The chamber component of claim 1, wherein the body consists essentially of yttrium oxide.

15. The chamber component of claim 1, wherein the corrosion-resistant coating further comprises a first additive comprising a UV-absorbing material.

16. The chamber component of claim 1, wherein the perfluoroelastomer material comprises an FFKM material, and wherein the corrosion-resistant coating is impregnated with a powdered yttrium oxide material, the powdered yttrium oxide material being present in the corrosion-resistant coating in an amount of 5% to 25% by volume.

* * * * *